United States Patent [19]

Lagoy, Jr.

[11] Patent Number: 4,918,645

[45] Date of Patent: Apr. 17, 1990

[54] COMPUTER BUS HAVING PAGE MODE MEMORY ACCESS

[75] Inventor: Brian E. J. Lagoy, Jr., West Townsend, Mass.

[73] Assignee: Wang Laboratories, Inc., Lowell, Mass.

[21] Appl. No.: 98,449

[22] Filed: Sep. 17, 1987

[51] Int. Cl.$^4$ .................. G06F 12/00; G06F 13/00
[52] U.S. Cl. ..................... 364/900; 364/940;
364/940.1; 364/940.2; 364/959.1; 364/964;
364/952; 364/952.1; 364/957; 364/957.1;
364/964.9; 364/968; 364/943; 364/943.43;
364/928; 364/927.2; 364/937.01; 364/942.8;
364/942
[58] Field of Search ............ 365/222; 371/13;
364/200 MS File, 900 MS File

[56] References Cited

U.S. PATENT DOCUMENTS

| | | | |
|---|---|---|---|
| 4,691,303 | 9/1987 | Churchward et al. | 365/222 |
| 4,694,454 | 9/1987 | Matsuura | 371/13 |
| 4,700,330 | 10/1987 | Altman et al. | 365/222 |
| 4,701,843 | 10/1987 | Cohen | 364/200 |
| 4,716,551 | 12/1987 | Inagaki | 365/222 |
| 4,754,425 | 6/1988 | Bhadriraju | 364/900 |

OTHER PUBLICATIONS

"High Performance 32-Bit Bus Standard P1296", (Unapproved Draft), The institute of Electrical and Electronics Engineers, Inc., Jun. 20, 1986.
"Dame-II Chip", NCR Corporation Preliminary Functional Specification 530-0006100, Jul., 1986.
"Boss Chip", NRC Corporation Functional Specification 530-0006112, Feb., 1987.

Primary Examiner—Raulfe B. Zache
Assistant Examiner—Glenn Richman
Attorney, Agent, or Firm—Michael H. Shanahan

[57] ABSTRACT

Method and apparatus are disclosed for use in a digital computer system having a system bus for interconnecting together various agents. A page mode type of memory access provides for the rapid transmission of a block of data across the bus. Blocked refresh circuitry is also employed which disables, if possible, the burst refresh of the memory until a data transfer is completed. A local processor upon an agent having a memory controlled in such manner is provided with a high priority signal line for overriding a current bus transfer for gaining access to the memory. During such a high priority access the blocked refresh circuitry operates in a manner somewhat similar to its operation during the sequential bus transfer, however fewer rows are refreshed during the burst refresh.

20 Claims, 6 Drawing Sheets

FIG. 3 (CONVENTIONAL RAS-CAS CYCLES)

FIG. 4 (PAGE MODE CYCLES)

COMPUTER BUS HAVING PAGE MODE MEMORY ACCESS

FIELD OF THE INVENTION

This invention relates generally to digital computers and, in particular, relates to a digital computer system having a system bus for interconnecting various agents and a page mode memory access for transferring blocks of data between agents.

BACKGROUND OF THE INVENTION

Modern computer systems are often characterized by a plurality of functionally different types of circuit cards, or agents, which are interconnected by means of a system bus. In order to facilitate the design of such circuit cards and the implementation of software routines necessary to utilize these cards such computer buses are typically standardized. One such bus is a 32-bit high performance synchronous bus known as the P1296, which is also commonly known as Multibus II.

Such a bus typically comprises a plurality of predefined signal lines which are utilized for the transfer of memory addresses and data between two or more circuit boards which are interconnected to the bus. Other signal lines are defined for regulating the transfer of data over the bus, for interrupt events, and for error conditions. Also, one or more clocks are provided by the bus for synchronizing the flow of data between agents. Typically, such a bus will have interconnected thereto at least one circuit card having a data processor contained thereon, such as a microprocessor device. Other circuit cards may comprise input/output (I/O) circuitry for interfacing to external devices such as mass storage devices, CRTs and printers. Other cards interconnected to the bus may be high capacity memory cards which comprise a plurality of read/write memories such as dynamic random access memories (DRAM) which are operable for the storage and retrieval of data. Additionally, a circuit card such as a card adapted for control of a mass storage device may also have a relatively large amount of DRAM for local buffering of data going to and coming from the mass storage device and may also have a local microprocessor device for controlling the mass storage device.

A problem arises when it is desired to transfer relatively large blocks of data between circuit cards on such a bus. Inasmuch as the bus may be considered to be a shared resource which is common to all of the circuit cards which are interconnected to the bus, it is desirable that such data transfers occur in a rapid manner to avoid a reduction in the bandwidth of the bus.

In order to achieve an increased bus bandwidth it has been known to provide a first in/first out (FIFO) buffer upon both a requesting agent and a replying agent. For example, the requesting agent may notify the replying agent that it desires a block of data to be read from a local memory on the replying agent and thereafter transmitted to the requesting agent over the bus. In response thereto the replying agent accesses the desired memory locations and loads the data contained therein into the replying agent's FIFO, the data thereafter being transmitted from the FIFO across the bus to a FIFO on the requesting agent from where the requesting agent may extract and store the data in a local memory. As can be appreciated, the use of such FIFO buffers may result in the system incurring additional costs and complexity. Furthermore, the storage capacity of available FIFO buffers may be insufficient to transfer a desired block size of data, resulting in the requirement that the FIFO be fully loaded two or more times with data.

In other systems it has been known to utilize memory interleaving in order to increase the data transfer speed of the bus. Memory interleaving however may also result in an increased system cost. Also, memory interleaving may increase the speed of only certain types of data transfers.

The problem of achieving or maintaining a high bus bandwidth is also related to a requirement that the memory devices, if they are DRAM devices, be periodically refreshed. This refresh requirement may result in the need to interrupt a block data transfer in order to accomplish the refresh. Also, if a local processor is included on the agent, the local processor may also require access to the memory, thereby also interfering with the transfer of data between agents.

SUMMARY OF THE INVENTION

The foregoing problems are overcome and other advantages are realized by a memory control apparatus for use in a data processing system having at least a requesting agent and a replying agent electrically coupled together by a system bus, the requesting agent requesting access to a memory on the replying agent for storing and retrieving data therein over the system bus. The memory control apparatus includes circuitry for detecting a request for initiating an access cycle to a memory on the replying agent and circuitry for asserting a plurality of memory address control signals for successively accessing the memory on the replying agent. The control signals include at least a row address strobe associated with a row address and a column address strobe associated with a column address. The memory control apparatus further includes circuitry for detecting a completion of the access cycle to the memory, the completion detecting circuitry being responsive to a logic state of an end of cycle control signal generated by the requesting agent. In accordance with the invention the row address strobe signal is asserted in conjunction with a row address indicative of a page of data within the memory, and thereafter the column address strobe signal is asserted and deasserted a plurality of times in conjunction with a plurality of column addresses for performing a page mode type of memory access. That is, the invention facilitates the transfer of blocks of data across a system bus by providing for a memory page mode type of access between the requesting agent and the replying agent. The invention also provides for the detection of memory page boundaries, the suspension of the page mode memory access and the reestablishment of the page mode memory access. The invention also provides a blocked refresh scheme for use in conjunction with the page mode memory access and for use with a local high priority data processor associated with the replying agent.

In accordance with a method of the invention there is disclosed a method for controlling a memory for use in a data processing system having at least a requesting agent and a replying agent electrically coupled together by a system bus, the requesting agent requesting access to a memory on the replying agent for storing and retrieving data therein over the system bus. The method includes the steps of detecting a request for initiating an access cycle to a memory on the replying agent and asserting a plurality of memory address control signals for accessing the memory on the replying agent. The control signals include at least a row address strobe associated with a row address and a column address strobe associated with a column address. The method further includes a step of detecting a completion of the access cycle to the memory. The step of asserting is accomplished by asserting the row address strobe signal in conjunction with a row address indicative of a page of data within the memory, and thereafter asserting and deasserting a plurality of times, the column address strobe signal in conjunction with a plurality of column addresses for performing a page mode type of memory access.

BRIEF DESCRIPTION OF THE DRAWINGS

The foregoing aspects of the invention will be more fully described below in the detailed description of the invention, the description being read in conjunction with the drawings wherein.

DETAILED DESCRIPTION OF THE INVENTION

Although the method and apparatus of the invention will be described herein in the context of a Multibus II environment, it should be appreciated that the invention may be practiced in many digital computer systems having a bus for transferring data between at least two agents interconnected upon the bus.

The operating characteristics of the Multibus II are described in a document entitled "High Performance 32-Bit Bus Standard P1296" which was produced by the IEEE microprocessor standards committee P1296 working group, Jun. 20, 1986, draft 2.0, the disclosure of which is incorporated herein in its entirety.

Figure 1:
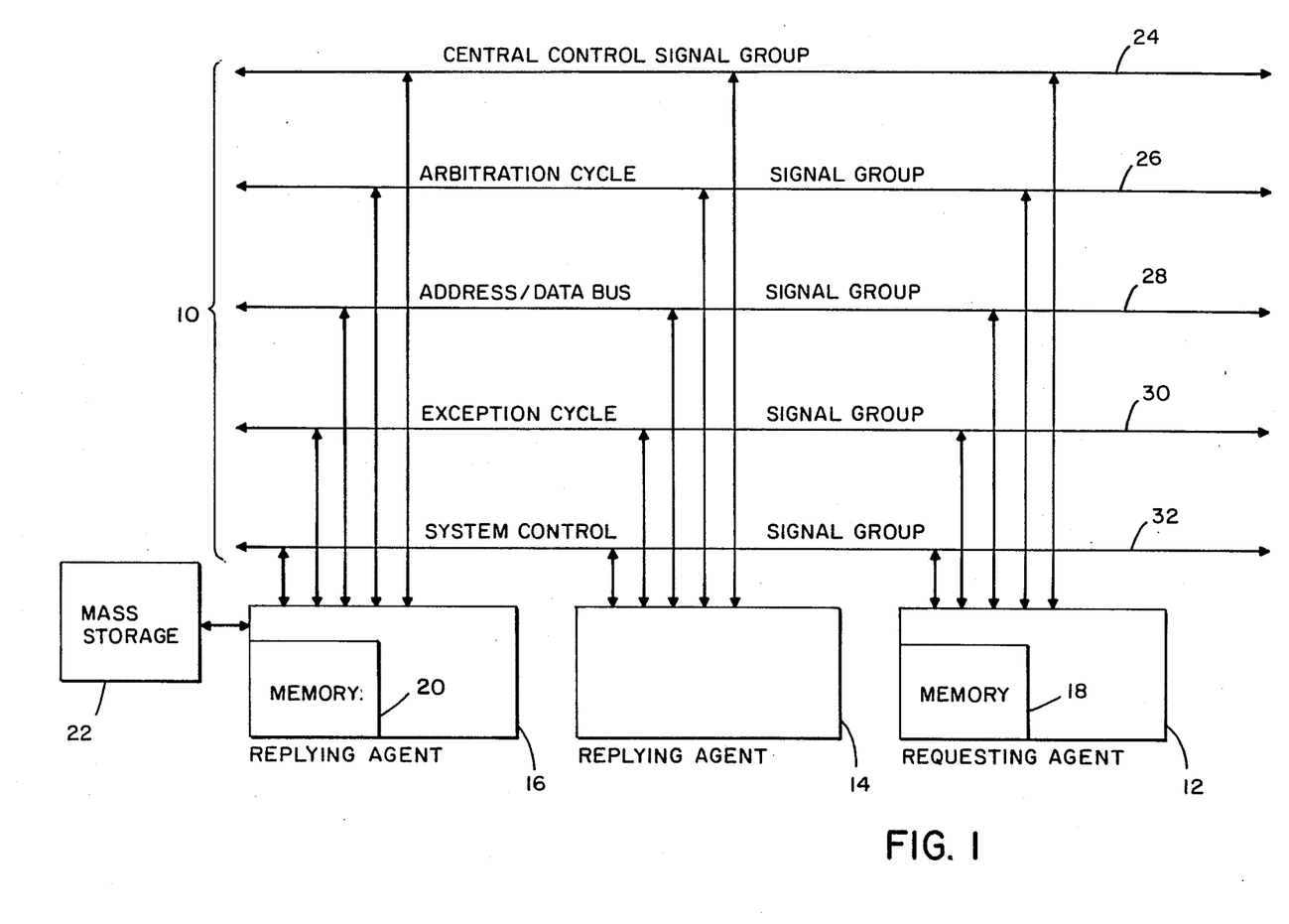
FIG. 1 is a block diagram of a system bus 10 having a plurality of agents coupled thereto illustrating various types of signal groups which comprise the bus 10.

Referring now to FIG. 1 there is shown in block diagram form a portion of a digital computer system 1 comprising a bus 10 and a plurality of agents 12-14 connected thereto. As shown in FIG. 1 a requesting agent 12 and replying agents 14 and 16 are bidirectionally coupled to the bus 10. The requesting agent 12 may have a local memory 18 which may be comprised of dynamic random access memories (DRAM). The replying agent 16 is also shown to have a local memory 20 which may be similarly comprised of DRAM. Also coupled to replying agent 16 is a mass storage device 22 which may comprise a familiar Winchester or floppy magnetic disk for the mass storage of data and program information.

Although one requesting agent 12 and two replying agents 14 and 16 are shown in FIG. 1, it should be realized that such a digital computer system may have a plurality of requesting agents and a plurality of replying agents coupled to the bus. It should further be realized that at one time in the operation of the system 1 that the requesting agent 12 may be a replying agent, and that the replying agent 16 may at that time be a requesting agent. The characterization of an agent as being either a replying agent or a requesting agent is accomplished by means of certain bus signals which will be described below.

As an example of the operation of such a system, if the system 1 is a word processing system the requesting agent 12 may be a central computer board and the replying agent 16 may be a disk controlling board which stores and retrieves document data from the mass storage device 22. In such a system an operator may interact via a keyboard or some other means with a program on the central computer board, the program embodying a word processing program wherein the operator enters document data which is stored on mass storage 22. Inasmuch as such document data may be organized as pages of data it can be appreciated that a certain block size of data may be utilized to represent a visually displayed page of a document, such as 2K bytes of data. Thus, it can still further be appreciated that it may be desirable in such a system to transfer blocks of data across the bus 10 as 2K byte blocks thereby facilitating the transfer of pages of document data in the system.

Bus 10 may comprise 96 discrete conductor lines, which are subdivided into groups having different functionality.

A central control signal group 24 provides system-wide signals such as reset and initialization control signals. In the Multibus II there are defined eight central control signals, some of which are a reset signal for initializing the system and two clock signals, namely a bus clock (BCLK*) 24b and a central clock (CCLK*).

Figure 5:
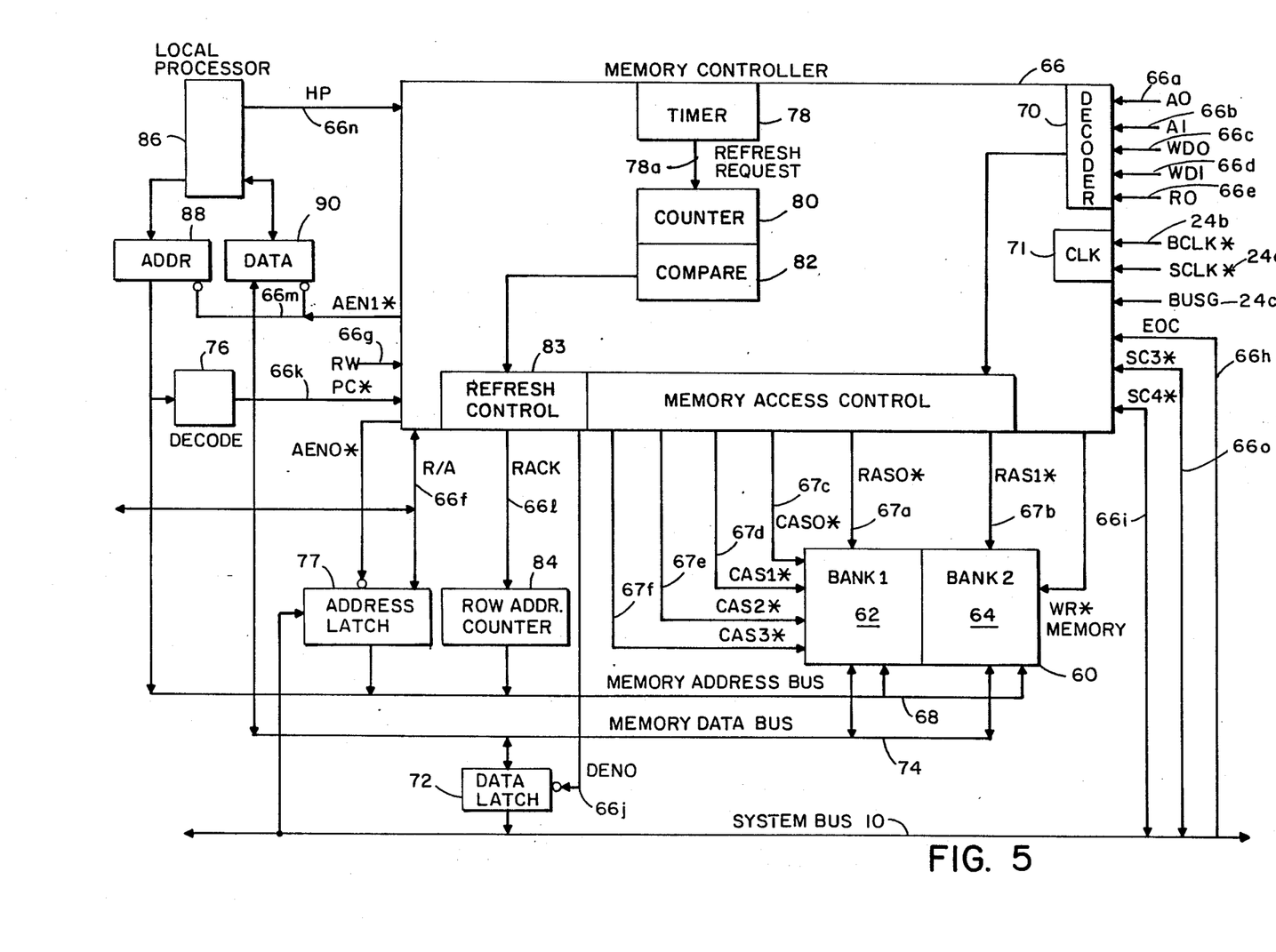
FIG. 5 is a block diagram which illustrates a memory controller 66 and other circuitry coupled to a memory 60.

However, it may be desirable in some systems to provide a third clock signal, such as a system clock (SCLK*) 24a (shown in FIG. 5 input to clock generator (CLK) 71). For example, the Multibus II specifies that CCLK* should be twice the frequency of BCLK*, with data transfers across the bus requiring one BCLK* cycle. Thus, if BCLK* is 10 MHZ then CCLK* is 20 MHZ and a bus data transfer requires 200 nanoseconds. However, in some systems it may be desirable to operate BCLK* at 5 MHZ, CCLK* at 10 MHZ while still requiring one BCLK* cycle to accomplish a bus data transfer. In such a system it may further be desirable to provide a higher frequency clock signal, such as SCLK* 24a operating at 20 MHZ, for generating high frequency bus timing and other signals on the plurality of agents coupled to the bus.

The arbitration cycle signal group 26 is comprised of seven signal lines, one being a bus request (BREQ*) which is wire ORED between each of the agents on the bus. Any agent requiring access to the bus 10 must assert BREQ* in order to be granted access, the access typically being granted (BUSG 24c) by an arbitration logic circuit which is not shown in FIG. 1. Six arbitration identification signals, ARB0*-ARB5*, are driven by an agent or agents which require access to the bus, these signals being inputs to the arbitration controller.

The address/data bus signal group 28 provides address, data and parity signals for data read and write bus transfers. There are a total of 36 address/data bus signals, characterized as 32 multiplexed address/data bus signals (AD0*-AD31*) and four parity signals associated with bytes of data, namely PAR0-PAR3*.

The exception cycle signal group 30 provides error detection which is utilized to terminate a bus transfer cycle. There are two exception cycle signals, a bus error signal (BUSERR*) and a time out signal (TIMOUT*).

A system control signal group 32 provides control signals which are utilized to transfer addresses and data over the bus. In the Multibus II there are 10 system control signals SC0*-SC9*. During a request phase of a bus transfer cycle the requesting agent 12 drives SC0* through SC9* to provide command information to the replying agent, such as the replying agent 16. During the reply phase of the bus transfer cycle the requesting agent drives SC9* and SC0*-SC3* while the replying agent drives SC8* and SC4*-SC7* in order to provide handshaking and status information between the requesting and replying agents.

In general, the Multibus II supports a plurality of different types of data transfers such as message types. These message types may be a plurality of unsolicited message types such as interrupts, and a solicited message type. Additionally, memory space data transfers may occur. Data transfers of up to 64K bytes are supported by the bus. However, in many conventional systems bus data transfers are limited to 32 byte packets. A first in/first out (FIFO) buffer is typically utilized on each agent, the FIFO buffer being fully loaded with data on the replying agent, the data thereafter being transferred to the bus 10 where it is received by a FIFO buffer on the requesting agent. As has been previously described, the use of such FIFO buffers may result in increased system cost and complexity. Additionally, a significant amount of time is required to fully load and unload the FIFO buffers.

Figure 2:
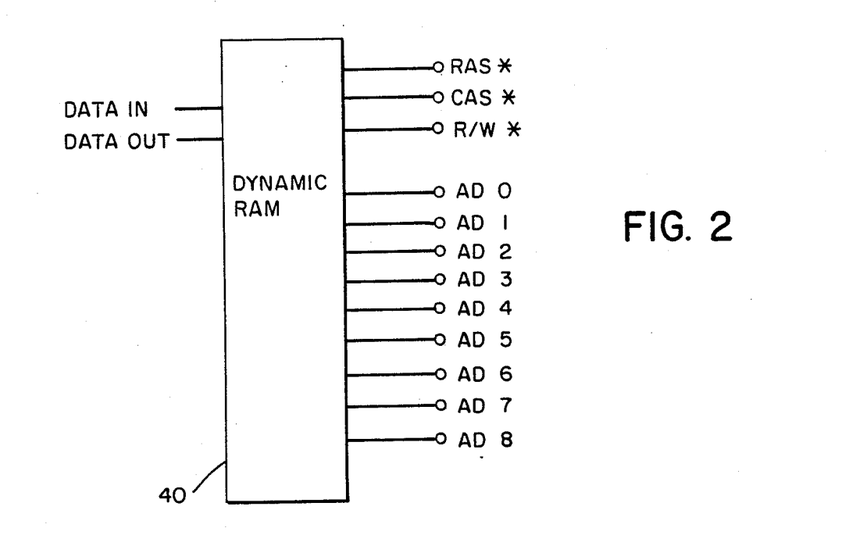
FIG. 2 is a block diagram of a typical DRAM which may be employed upon an agent coupled to the bus 10.
Figure 3:
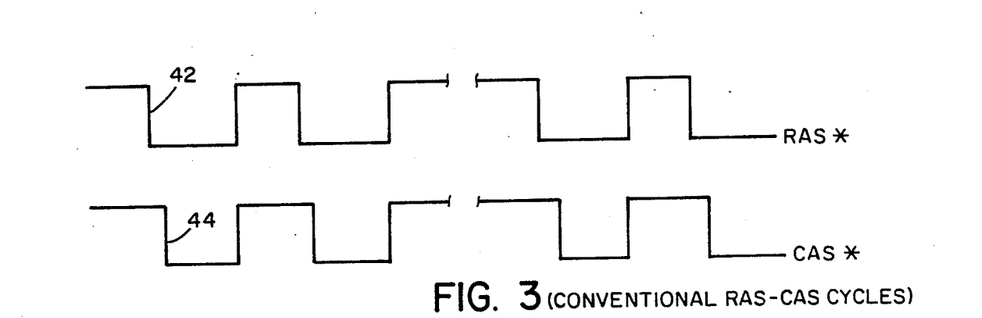
FIG. 3 is a simplified timing diagram showing typical Ras* - Cas* memory access cycles which may be employed to access the DRAM of FIG. 2.
Figure 4:
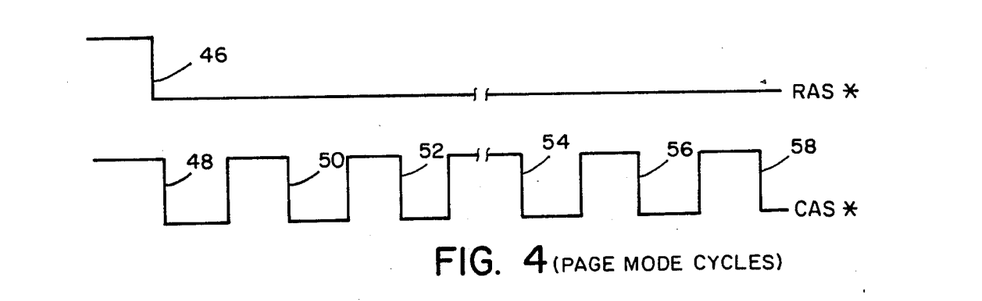
FIG. 4 is a simplified timing diagram showing page mode memory access cycles which are one feature of the invention.

Referring now to FIGS. 2, 3 and 4 there is shown a well known DRAM having a Data In and a Data Out signal line and a plurality of address lines AD0 through AD8. The DRAM 40 also has a Ras*, Cas*, and a R/W* signal control line. In order to achieve a large data storage device with a minimum of input signal pins and, hence, a small package size, such DRAMs typically multiplex the address lines such that at one time in the operation of the device the address lines are characterized as row address lines under the control of Ras* and at another time in the cycle are characterized as column address lines under the control of Cas*. The device shown in FIG. 2 has nine address signal pins and, thus, has a total of 18 address inputs which yield a device having a total of 256K bit storage locations. Of course, other DRAMs may have more or less than nine address inputs such as 64K and 1M bit devices and other devices may store more than one bit of data, such as devices adapted to simultaneously store and retrieve four bits of data.

As shown in FIG. 3 the conventional addressing mode for such a DRAM results in Ras* being asserted 42 for latching within the RAM the row address lines appearing on AD0-AD8. Subsequent to the assertion of Ras* the state of the address lines AD0-AD8 are switched to the desired column address and Cas* is asserted 44. The assertion of Cas* also typically either stores within the device or reads from the device, depending upon the state of R/W*, a bit of data at the specified row and column address.

In FIG. 4 there is shown another type of addressing mode known as a page mode type of access wherein Ras* is asserted once at 46 to latch the row address within the device. Thereafter, the column address may be repeatedly varied and Cas* may be asserted a plurality of times (48-58) in order to store or retrieve data. Inasmuch as the row address lines can be considered to define a page of data bits within the device, multiple assertions of Cas* can be utilized to "scroll" through the page of data in a significantly more rapid manner than the conventional Ras*-Cas* type of cycle. Such a page mode access is made especially convenient if the data is accessed sequentially, that is, if the column address is incremented or decremented by one for each access. Of course, non-sequential page mode access is also possible and may be desirable for some applications.

In accordance with the method and apparatus of the invention this page mode type of access cycle is advantageously employed to increase the bandwidth of the system bus for at least the memory space type of data transfer. Inasmuch as it has been known to utilize the conventional Ras*-Cas* type of cycle for transferring data to and from the bus, the delays incurred by the assertion of Ras* for each memory access often require that the aforementioned FIFO buffer be utilized to temporarily buffer data. In accordance with the invention, a much faster memory access cycle is achieved by employing the page mode type of access, thereby eliminating the need for local buffer storage of incoming or outgoing data in order to maintain a desired bus bandwidth.

Referring now to FIG. 5 there is shown an illustrative embodiment of the invention. A memory 60 is comprised of two banks of memory devices, such as DRAM devices, organized as a Bank 1 62 and a Bank 2 64. Selection between banks is made by Ras0* 67a and Ras1* 67b signal lines which are inputs to Bank 1 and Bank 2, respectively. Each of the Banks 62 and 64 is comprised of four subbanks of memory devices organized as bytes. Selection of a particular byte within a Bank is made by the state of the Cas0*-Cas3* (67c-67f) signal lines. The particular mode of addressing is determined by the state of the A0 66a, A1 66b, WD0 66c and WD1 66d signal lines which are inputs to a memory controller 66, these signal lines being, for example, various address signals of the Memory Address Bus 68 and control signals of the system control signal group 32. The states of the aforementioned signals are decoded by a decoder 70 associated with memory controller 66 to select both the width of the memory transfer and also the columns of memory devices which are selected. Truth tables which describe the operation of decoder 70 are given below.

TABLE 1

| WD1 | WD0 | Width of Memory Transfer |
|---|---|---|
| 0 | 0 | 32 Bits |
| 0 | 1 | 24 bits |
| 1 | 0 | 16 bits |
| 1 | 1 | 8 bits |

TABLE 2

| WD1 | WD0 | A1 | A0 | CAS3* | CAS2* | CAS1* | CAS0* |
|---|---|---|---|---|---|---|---|
| 0 | 0 | 0 | 0 | 1 | 1 | 1 | 1 |

TABLE 2-continued

| WD1 | WD0 | A1 | A0 | CAS3* | CAS2* | CAS1* | CAS0* |
|---|---|---|---|---|---|---|---|
| 0 | 0 | 0 | 1 | 1 | 1 | 1 | 0 |
| 0 | 0 | 1 | 0 | 1 | 1 | 0 | 0 |
| 0 | 0 | 1 | 1 | 1 | 0 | 0 | 0 |
| 0 | 1 | 0 | 0 | 0 | 1 | 1 | 1 |
| 0 | 1 | 0 | 1 | 1 | 1 | 1 | 0 |
| 0 | 1 | 1 | 0 | 1 | 1 | 0 | 0 |
| 0 | 1 | 1 | 1 | 1 | 0 | 0 | 0 |
| 1 | 0 | 0 | 0 | 0 | 0 | 1 | 1 |
| 1 | 0 | 0 | 1 | 0 | 1 | 1 | 0 |
| 1 | 0 | 1 | 0 | 1 | 1 | 0 | 0 |
| 1 | 0 | 1 | 1 | 1 | 0 | 0 | 0 |
| 1 | 1 | 0 | 0 | 0 | 0 | 0 | 1 |
| 1 | 1 | 0 | 1 | 0 | 0 | 1 | 0 |
| 1 | 1 | 1 | 0 | 0 | 1 | 0 | 0 |
| 1 | 1 | 1 | 1 | 1 | 0 | 0 | 0 |

An R0 66e input to memory controller 66 may also be an address line, the state of which selects either Bank 1 or Bank 2 for access via Ras0* or Ras1*.

A request/acknowledge (R/A) 66f input signal is a bidirectional signal which is normally an input to memory controller 66 when the controller 66 is in a quiescent operating state. When a request for access to memory 60 is made by a requesting agent during the request phase of a sequential data transfer the R/A signal line may be pulsed low by external logic (not shown). After making such a request for memory access the R/A signal line may be released by the external logic such that it may be driven by controller 66 during the memory request acknowledge cycle. In response to the request memory controller 66 accesses the memory 60 in accordance with the states of the A0 66a, A1 66b, WD0 66c, WD1 66d and R0 66e lines in conjunction with the state of the Read/Write (RW) 66g input. Memory controller 66 then drives R/A 66f to a logic low signal level to acknowledge the memory access. After initiating a memory access the memory controller 66 accesses the memory repeatedly until an EOC 66h signal line (bus signal SC2*) is asserted for indicating an End of Cycle condition. When EOC 66h is asserted the memory controller 66 is informed that the current memory access is the final memory access of the reply phase of the sequential data transfer.

Figure 6:
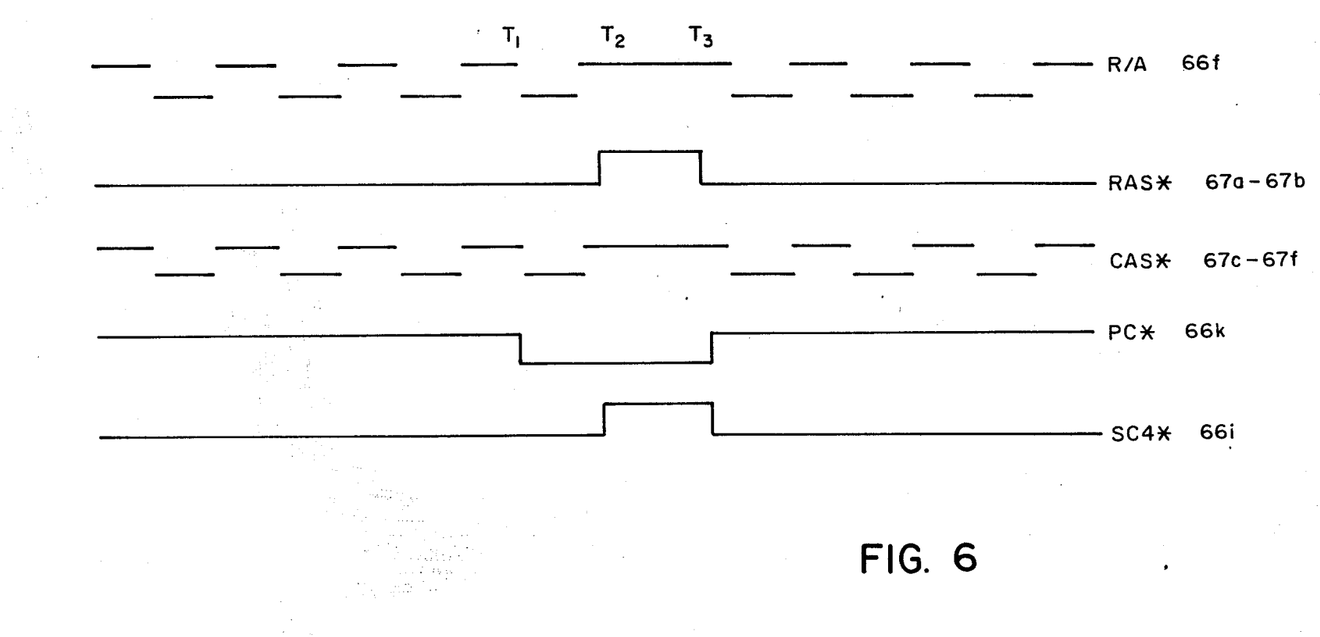
FIG. 6 is a timing diagram which shows the result of the detection of a page crossing signal.

Referring now to FIG. 6 there is shown a timing diagram which illustrates a portion of consecutive memory accesses made by controller 66 to memory 60 during the reply phase of a sequential data transfer. As can be seen, for each access the R/A 66f signal line is driven low by controller 66 and thereafter released. During these memory cycles, and in accordance with the invention, the Ras* line is maintained in an asserted, or low state, and the Cas* line is repeatedly toggled to achieve a page mode memory access cycle. During consecutive page mode access cycles the SC4* 66i signal line is asserted by memory controller 66 for notifying the requesting agent that the replier ready condition exists, that is, that the memory controller 66 is accessing data for the requester. A DENO 66j signal line output by the memory controller may be utilized, when data is being read from memory 60, to enable a buffer 72 for placing the data from the Memory Data Bus 74 onto the system bus 10.

In reference to FIG. 6 it can be appreciated that the page mode type of memory access, which is a feature of the invention, advantageously provides for a high bus bandwidth. Inasmuch as the Ras* signal line is not required to be driven for each memory access, the additional delay incurred by the assertion of Ras* in conjunction with each Cas* is eliminated, thereby increasing the speed of the overall transfer of a block of data to or from the memory 60.

For the DRAM shown in FIG. 2 a given page of data is characterized by the nine row address lines associated with the Ras* signal. Thus, the DRAM can be seen to comprise 512 pages of data. Also, each page has 512 storage locations, due to the nine column address lines associated with the Cas* signal. If a desired block size of data exceeds 512 bytes it is necessary to access more than one page of data within the device. In accordance with the invention, this is accomplished by a memory column address decoder 76 which may be a nand gate having nine inputs for detecting when the column address lines are each at a logic one condition. Thus, the output of the decoder 76 is a Page Crossing Detect (PC*) 66k signal which is an input to the memory controller 66. This is illustrated in FIG. 6 at time $T_1$ where PC* 66k is driven low by the decoder 76. In response thereto the current memory access is completed and the Ras* signal line is driven high by memory controller 66 in conjunction with the R/A 66f signal and also SC4* 66i. This operation of memory controller 66 notifies the agent receiving data, via the deassertion of the replier ready handshaking signal SC4*, that the replier is no longer in a ready condition. While Ras* is deasserted the row address within address latch 77 is, for example, incremented by 1 to select the next consecutive page of data within the memory devices. Thereafter at time $T_3$ RAS* is assertd, thereby latching the new row address into the memory devices and the page mode memory access cycles begin as before, the SC4* 66i line being once more asserted and R/A being once more driven to a low state.

In accordance with the invention the refresh of DRAM within the memory 60 may be accomplished by a blocked refresh technique. A timer 78 generates refresh request 78a at predetermined intervals, such as a refresh request every 13.8 microseconds. The refresh requests are counted by a refresh request counter 80 and a comparator 82 determines when the number of counted refresh requests equal or exceed a predetermined threshold value, such as 24. As this time controller 66 will attempt to burst refresh all of the 24 pending requests. If, however, there is a bus transfer in progress the memory controller 66 will not perform the burst refresh. The memory controller 66 will attempt to wait until the bus transfer is completed, that is, a transfer has occured wherein EOC 66h is asserted. If, however, the counter 80 indicates that some maximum number of refresh requests are pending, such as 41, the bus transfer is interrupted and the burst refresh is performed. When the bus transfer is interrupted all of the pending refreshes are performed. The particular numbers chosen as the pending refresh threshold and the maximum number of pending refreshes are determined such that the amount of time represented by the difference between the threshold and the maximum values is a sufficient amount of time within which to transfer some predetermined block size of data. For example, for a refresh request made every 13.8 microseconds the difference between 24 and 41 refresh requests is approximately 234.5 microseconds which, it has been found, is a sufficient amount of time to complete a 2K byte (2048 bytes) bus transfer operation. Thus, if a 2K byte sequential bus transfer operation is initiated just prior to the time when 24 pending refresh requests are accumulated the bus transfer will run to completion before the memories are refreshed. Preferably, an even number of rows are refreshed during the burst, such as 42 rows if the maximum value is indicated by counter 80.

In order to burst refresh the memories a refresh acknowledge (RACK) 66*l* signal is generated by a refresh controller 83, the RACK 66*l* signal enabling a refresh row counter 84 to place the refresh row addresses on the memory address bus. RACK 66*l* is subsequently toggled between a high and a low state under the control of controller 83 for, as an example, 24 cycles in order to burst refresh 24 row addresses. During refresh the RAS0* 67*a* and RAS1* 67*b* signals are preferably both asserted to refresh simultaneously both banks of memory. The refresh row counter 84 may be incremented by the rising edge of the RACK 66*l* signal such that at the completion of each refresh cycle counter 84 has a value corresponding to the next row address to be refreshed.

A local processor 86 may also have access to the memory 60 via separate address and data latches 88 and 90, respectively. Local processor 86 may also be serviced by a dedicated memory controller (not shown) operable for generating memory access signals. When the local processor is granted access to the memory 60 the AEN1 66*m* signal is driven to enable the address and data latches of the local processor onto the memory address and memory data buses 68 and 70, respectively.

In accordance with the invention, the local processor is also provided with a High Priority (HP) 66*n* signal which is an input to the memory controller 66 to interrupt, if necessary, a current bus transfer. The HP66*n* signal therefore allows the local processor to gain access to the memories by overriding a current bus transfer. The HP 66*n* signal will override the current bus transfer for as long as it is asserted, thereby allowing the local processor 86 to make a number of consecutive high priority accesses to the memory 60.

Figure 7:
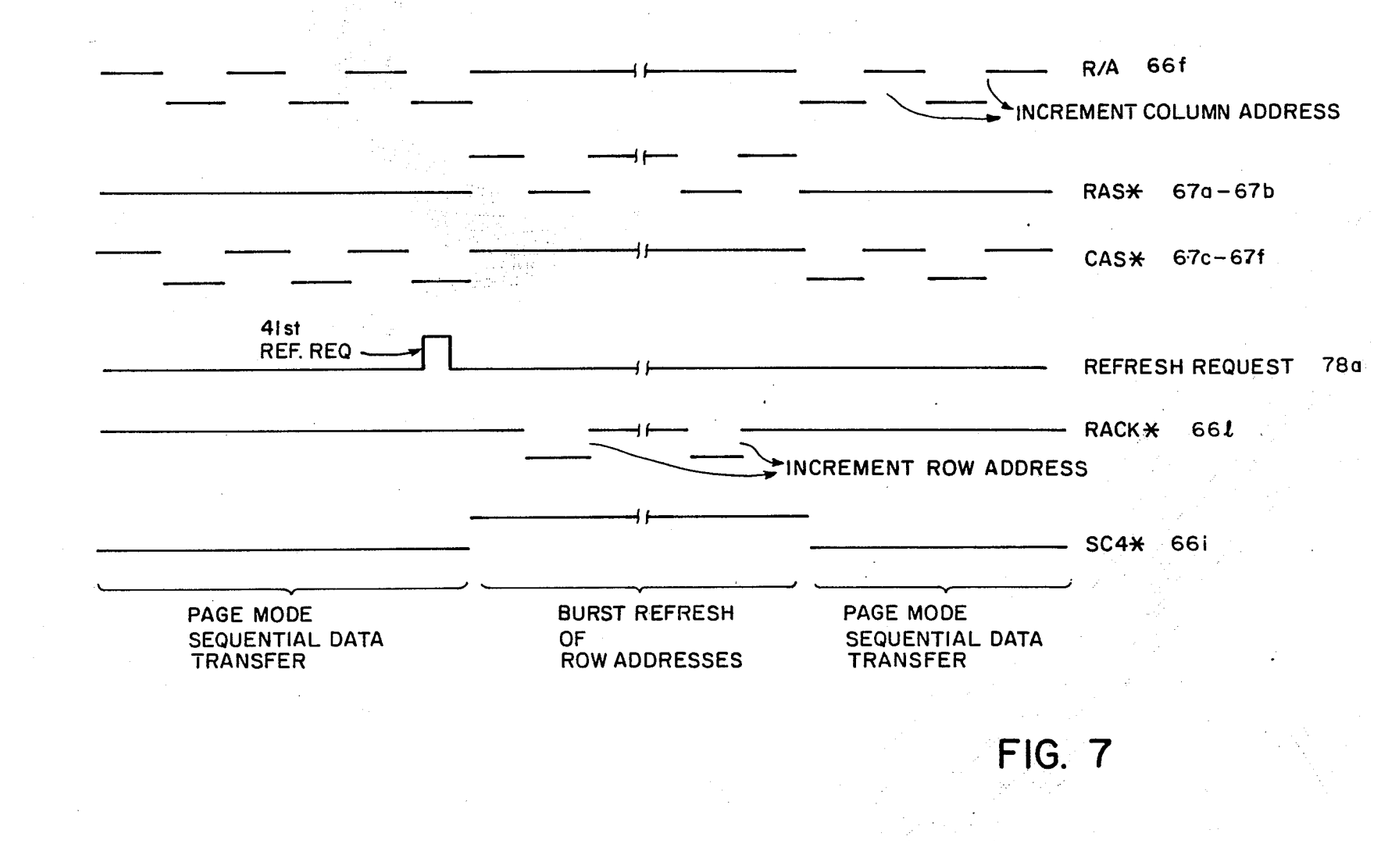
FIG. 7 is a timing diagram which shows a burst refresh of the memory 60.
Figure 8:
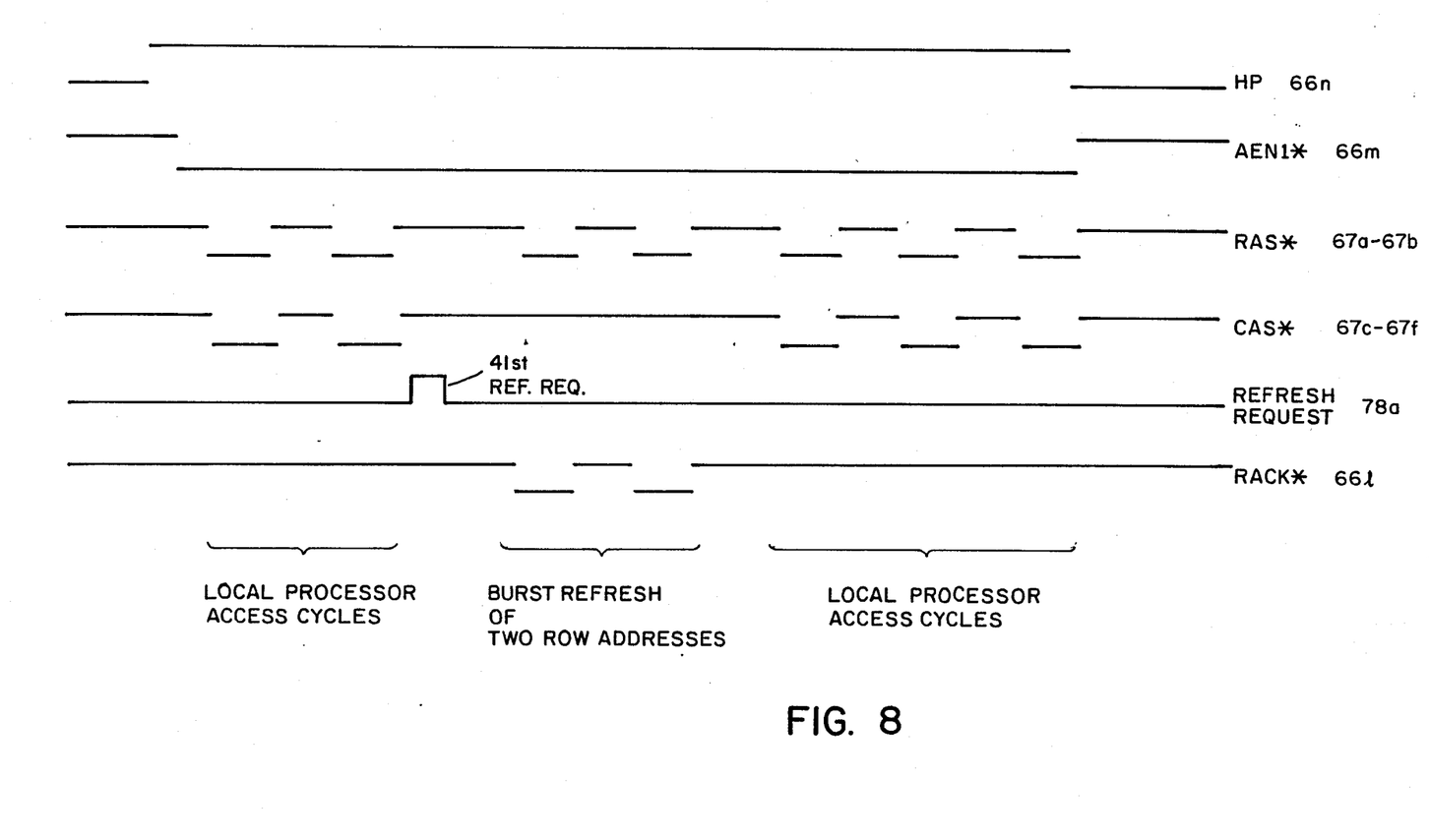
FIG. 8 is a timing diagram which shows the refresh of the memory 60 during a high priority local processor access.

The aforedescribed blocked refresh operates somewhat differently if a series a high priority local processor memory accesses are in progress. As described previously, the memory controller 66 will accumulate pending refresh requests up to a maximum number of 41. If a high priority access is in progress at this time, the high priority access will be temporarily overridden but only two memory refreshes will take place. Thus, the high priority access by the local processor is suspended for only a relatively brief period of time before the local processor is once again granted access to the memory 60. Of course, after the two refreshes are accomplished the counter 80 will continue to accumulate refresh requests such that when the counter once again reaches 41 and, if the high priority access is still in progress, the memory controller will once again suspend the high priority access and burst refresh to the next consecutive two row addresses. The operation of the aforedescribed blocked burst refresh and high priority request are shown in the waveforms of FIGS. 7 and 8.

It can be appreciated that the foregoing description of the memory controller 66 and the associated circuitry is illustrative and that a number of different embodiments may occur to those skilled in this art. For example, the aforedescribed functions of the memory controller 66 may be accomplished by a plurality of discrete logic devices or, preferably, may be embodied within a LSI semiconductor device. Similarly, the various elements associated with memory controller 66 may or may not be included within such an LSI device. For example, the timer 74 may be external to the device as may be the refresh counter 80. It should be further realized that the memory controller 66 may operate with still other devices which are adapted for monitoring and controlling the system bus 10 activity, such as a device operable for asserting R/A when a request is made by another agent on the bus 10 for access to the memory 60. Also, and by example, the SC3* 66*o* and SC4* 66*i* signal lines may not be tied directl from the bus 10 to the memory controller but may be buffered or otherwise modified by other logic devices.

Therefore, the present invention is not to be considered to be limited to the embodiment described herein, the invention is instead meant to be limited only as defined by the appended claims.

What is claimed is:

1. Memory control apparatus for use in a data processing system having at least a requesting agent and said replying agent electrically coupled together by a system bus, the requesting agent requesting access to a memory on the replying agent for storing and retrieving data therein over the system bus, the apparatus comprising:

means, associated with a replying agent, for detecting a request for initiating an access to a memory on the replying agent, the request detecting means being coupled to a system bus, and request being made over the system bus by a requesting agent;

means, responsive to the request detecting means detecting the request, for asserting a plurality of memory address control signals for accessing a plurality of times the memory on the replying agent, the control signals comprising at least a row address strobe signal associated with a memory row address and a column address strobe signal associated with a memory column address; and means for detecting a completion of the access to the memory, the completion detecting means being responsive to an end of access control signal generated by the requesting agent, the access completion detecting means being coupled to the memory address control signal asserting means for halting the operation thereof after the end of access control signal is detected; and wherein the memory address control signal asserting means asserts the memory address control signals by asserting the row address strobe in conjunction with a row address being indicative of a page of data within the memory, and thereafter asserts and deasserts a plurality of times the column address strobe signal in conjunction with a plurality of column addresses for performing a page mode type of memory access.

2. The memory control apparatus of claim 1 and further comprising:

means for generating a memory refresh request signal at predetermined intervals;

means for counting each of the refresh request signals;

means, coupled to the refresh request signal counting means, for comparing a value of the counted refresh request signals to a predetermined threshold value and for determining when a number of counted refresh request signals equals or exceeds the predetermined threshold value; and means, responsive to the comparing means determining that a number of counted refresh request signals at least equals the predetermined threshold value, for refreshing a plurality of memory rows, the number of memory rows being refreshed being substantially equal to the counted value.

3. The memory control apparatus of claim 2 wherein the memory row refreshing means is coupled to the memory address control signal asserting means and is responsive to an operation of the memory address control signal asserting means for disabling refreshing of the memory during the operation of the memory address control signal asserting means.

4. The memory control apparatus of claim 3 wherein the comparing means further comprises means for comparing the value of the counted signals to a predetermined maximum value for determining when a number of counted refresh request signals equals the predetermined maximum value, and wherein the memory row refreshing means is further responsive to an operation of the maximum value comparing means for determining when the counted value equals the predetermined maximum value for suspending an operation of the memory address control signal asserting means and for refreshing a predetermined number of rows of the memory.

5. The memory control apparatus of claim 4 wherein the predetermined interval is approximately 13.8 microseconds, wherein the predetermined threshold value and the predetermined maximum value are 24 and 41, respectively, and wherein the predetermined number of rows is an even number of rows.

6. The memory control apparatus of claim 1 and further comprising:

means for detecting a memory page boundary having inputs coupled to the memory column address and an output expressive of a state of the memory column address that is indicative of a memory page boundary; and means, responsive to the output of the memory page boundary detecting means, for deasserting the row address strobe signal, providing a memory row address expressive of another page of data, and reasserting the row address strobe signal.

7. The memory control apparatus of claim 4 wherein the replying agent further has a local data processing means coupled to the memory and wherein the memory control apparatus further comprises:

means, responsive to an occurrence of a high priority memory access request from the local data processing means, for suspending an operation of the memory address control signal asserting means for accessing the memory in response to a request from the requesting agent; and means, responsive to an occurrence of a high priority memory access request, for enabling the accessing of the memory by the local data processing means.

8. The memory control apparatus of claim 7 wherein the memory row refreshing means is coupled to the memory address control signal asserting means and is responsive to an occurrence of a high priority memory access request for disabling the refresh of the memory during an operation of the local data processing means access enabling means.

9. The memory control apparatus of claim 8 wherein the predetermined interval is approximately 13.8 microseconds, wherein the threshold value and the maximum value are 24 and 41, respectively, and wherein the predetermined number of rows is two.

10. The memory control apparatus of claim 1 wherein said bus comprises three clock signal lines and wherein a first one of said clock signal lines has a first given frequency, a second one of said clock signal lines has a second given frequency substantially equal to two times said first given frequency and a third one of said clock signal lines has a third given frequency substantially equal to four times said first given frequency.

11. The memory control apparatus of claim 10 wherein said first given frequency is substantially equal to 5 MHZ.

12. A method for controlling a memory for use in a data processing system having at least a requesting agent and a replying agent electrically coupled together by a system bus, the requesting agent requesting access to a memory on the replying agent for storing and retrieving data therein over the system bus, the method comprising the steps of:

detecting a request from a requesting agent for initiating an access to said memory on a replying agent;

asserting a plurality of memory address control signals for accessing the memory on the replying agent, the control signals comprising at least a row address strobe signal associated with a memory row address and a column address strobe signal associated with a memory column address; and detecting a logic state of an end of access system bus control signal that indicates a completion of the access to the memory; and wherein the step of asserting is accomplished by asserting the row address strobe signal in conjunction with a memory row address indicative of a page of data within the memory, and thereafter asserting and deasserting a plurality of times the column address strobe signal, in conjunction with a plurality of memory column addresses, for performing a page mode type of memory access.

13. The method of claim 12 and further comprising the steps of:

generating a memory refresh request signal at predetermined intervals;

counting each of the memory refresh request signals;

comparing a value of the counted memory refresh request signals to a predetermined threshold value for determining when a number of counted memory refresh request signals equals or exceeds the predetermined threshold value; and refreshing a plurality of memory rows, a number of rows being refreshed being equal to the counted value of the memory refresh request signals.

14. The method of claim 13 and further comprising the step of suspending the step of refreshing a plurality of memory rows during a performance of the step of asserting.

15. The method of claim 14 wherein the step of comparing further comprises a step of:

comparing the value of the counted memory refresh request signals to a predetermined maximum value;

determining when the counted value of the memory refresh request signals equals the predetermined maximum value;

suspending the performance of the step of asserting; and refreshing a predetermined number of rows of the memory.

16. The method of claim 15 wherein the predetermined interval is approximately 13.8 microseconds, wherein the threshold value and the predetermined maximum value are 24 and 41, respectively, and wherein the predetermined number of rows is an even number of rows.

17. The method of claim 12 wherein step of asserting further comprises the steps of:
   detecting a memory page boundary by monitoring the memory column address to detect a memory column address that is indicative of a memory page boundary;
   deasserting the row address strobe signal;
   providing a row address expressive of another page of data; and
   reasserting the row address strobe.

18. The method of claim 15 wherein the replying agent has a local data processing means coupled to the memory and further comprising the step of, in response to a request from the local data processing means for access to the memory:
   suspending the performance of the step of asserting; and
   enabling the accessing of the memory for the local data processing means.

19. The method of claim 18 and further comprising the step of suspending the performance of the step of refreshing a plurality of memory rows during the step of enabling.

20. The method of claim 19 wherein the predetermined interval is approximately 13.8 microseconds, wherein the threshold value and the maximum value are 24 and 41, respectively, and wherein the predetermined number of rows is two.

* * * * *

(12) EX PARTE REEXAMINATION CERTIFICATE (6565th)
United States Patent
Lagoy, Jr.

(10) Number: US 4,918,645 C1
(45) Certificate Issued: Dec. 16, 2008

(54) COMPUTER BUS HAVING PAGE MODE MEMORY ACCESS

(75) Inventor: Brian E. J. Lagoy, Jr., West Townsend, MA (US)

(73) Assignee: LG Electronics Inc., Anyang-Shi, Kyong Ki-Do (KR)

Reexamination Request:
No. 90/006,789, Oct. 14, 2003
No. 90/007,420, Feb. 14, 2005
No. 90/008,391, Feb. 26, 2007

Reexamination Certificate for:
Patent No.: 4,918,645
Issued: Apr. 17, 1990
Appl. No.: 07/098,449
Filed: Sep. 17, 1987

(51) Int. Cl.
  *G11C 8/12* (2006.01)
  *G11C 8/00* (2006.01)
  *G11C 7/10* (2006.01)
  *G11C 11/406* (2006.01)

(52) U.S. Cl. .................................... 711/151; 711/106
(58) Field of Classification Search ................... None
See application file for complete search history.

(56) References Cited

U.S. PATENT DOCUMENTS

| | | | |
|---|---|---|---|
| 3,846,765 A | 11/1974 | De Vries |
| 3,969,706 A | 7/1976 | Proebsting et al. |
| 4,152,764 A | 5/1979 | Connors et al. |
| 4,156,938 A | 5/1979 | Proebsting et al. |
| 4,181,933 A | 1/1980 | Benysek |
| 4,207,618 A | 6/1980 | White, Jr. et al. |
| 4,240,138 A | 12/1980 | Chauvel |
| 4,272,819 A | 6/1981 | Katsumata et al. |
| 4,333,167 A | 6/1982 | McElroy |
| 4,344,157 A | 8/1982 | White, Jr. et al. |
| 4,365,294 A | 12/1982 | Stokken |
| 4,366,539 A | 12/1982 | Johnson et al. |
| 4,410,943 A | 10/1983 | Barlow |
| 4,429,375 A | 1/1984 | Kobayashi et al. |
| 4,484,308 A | 11/1984 | Lewandowski et al. |

(Continued)

FOREIGN PATENT DOCUMENTS

| | | |
|---|---|---|
| EP | 0 120 745 | 10/1984 |
| EP | 144 432 | 6/1985 |
| EP | 0 208 325 A2 | 1/1987 |
| EP | 0 213 395 A2 | 3/1987 |
| GB | 2 093 236 A | 8/1982 |
| JP | 54-155737 | 12/1979 |
| JP | 57-162164 | 10/1982 |
| JP | 57-208686 | 12/1982 |
| JP | 58-4447 | 1/1983 |
| JP | 58-64528 | 4/1983 |

(Continued)

OTHER PUBLICATIONS

82CO8 CHMOS Dynamic Ram Controller, Intel Corp., pp. 1–29, Sep. 1990.*
"Intel Multibus II Bus Architecture Specification Handbook", Intel Corporation, 1984.*

(Continued)

*Primary Examiner*—Albert J Gagliardi (57) ABSTRACT

Method and apparatus are disclosed for use in a digital computer system having a system bus for interconnecting together various agents. A page mode type of memory access provides for the rapid transmission of a block of data across the bus. Blocked refresh circuitry is also employed which disables, if possible, the burst refresh of the memory until a data transfer is completed. A local processor upon an agent having a memory controlled in such manner is provided with a high priority signal line for overriding a current bus transfer for gaining access to the memory. During such a high priority access the blocked refresh circuitry operates in a manner somewhat similar to its operation during the sequential bus transfer, however fewer rows are refreshed during the burst refresh.

U.S. PATENT DOCUMENTS

| | | | |
|---|---|---|---|
| 4,485,461 A | | 11/1984 | Kobayashi |
| 4,486,856 A | * | 12/1984 | Heckel et al. ............... 345/557 |
| 4,500,961 A | | 2/1985 | Engles |
| 4,513,368 A | | 4/1985 | Houseman |
| 4,514,808 A | | 4/1985 | Murayama et al. |
| 4,517,643 A | | 5/1985 | Bannai |
| 4,528,626 A | | 7/1985 | Dean et al. |
| 4,546,451 A | * | 10/1985 | Bruce ........................ 345/571 |
| 4,571,676 A | | 2/1986 | Mantellina et al. |
| 4,575,825 A | | 3/1986 | Ozaki et al. |
| 4,581,721 A | | 4/1986 | Gunawardana |
| 4,586,167 A | | 4/1986 | Fujishima et al. |
| 4,587,629 A | | 5/1986 | Dill et al. |
| 4,591,972 A | | 5/1986 | Guyer et al. |
| 4,597,041 A | | 6/1986 | Guyer et al. |
| 4,601,018 A | | 7/1986 | Baum et al. |
| 4,623,986 A | | 11/1986 | Chauvel |
| 4,625,301 A | | 11/1986 | Berger |
| 4,628,450 A | | 12/1986 | Sato et al. |
| 4,649,522 A | | 3/1987 | Kirsch |
| 4,663,735 A | | 5/1987 | Novak et al. |
| 4,675,850 A | | 6/1987 | Kumanoya et al. |
| 4,691,303 A | * | 9/1987 | Churchward et al. ........ 365/222 |
| 4,718,006 A | | 1/1988 | Nishida |
| 4,725,987 A | | 2/1988 | Cates |
| 4,730,308 A | | 3/1988 | Friedman et al. |
| 4,750,839 A | | 6/1988 | Wang et al. |
| 4,754,433 A | | 6/1988 | Chin et al. |
| 4,766,431 A | * | 8/1988 | Kobayashi et al. .......... 345/570 |
| 4,789,967 A | | 12/1988 | Liou et al. |
| 4,792,929 A | | 12/1988 | Olson et al. |
| 4,797,850 A | | 1/1989 | Amitai |
| 4,816,814 A | * | 3/1989 | Lumelsky .................... 345/441 |
| 4,823,324 A | | 4/1989 | Taylor et al. |
| 4,839,856 A | * | 6/1989 | Tanaka ...................... 711/211 |
| 4,928,234 A | | 5/1990 | Kitamura et al. |
| 4,965,722 A | | 10/1990 | Tokuume |
| 5,109,330 A | | 4/1992 | Pfeiffer et al. |

FOREIGN PATENT DOCUMENTS

| | | |
|---|---|---|
| JP | 58-137064 | 8/1983 |
| JP | 58-224497 | 12/1983 |
| JP | 59-139195 | 8/1984 |
| JP | 59-167766 | 9/1984 |
| JP | 59-175086 | 10/1984 |
| JP | 59-180877 | 10/1984 |
| JP | 60-27964 | 2/1985 |
| JP | 60-41156 | 3/1985 |
| JP | 60-74174 A | 4/1985 |
| JP | 60-103590 | 6/1985 |
| JP | 60-140454 | 7/1985 |
| JP | 60-211690 | 10/1985 |
| JP | 60-166899 | 11/1985 |
| JP | 61-2226 | 1/1986 |
| JP | 61-177560 | 8/1986 |
| JP | 61-227295 | 10/1986 |
| JP | 62-160528 | 7/1987 |
| JP | 62-501656 | 7/1987 |
| JP | 62-203250 | 9/1987 |
| JP | 62-219058 | 9/1987 |
| JP | 62-271030 | 11/1987 |
| JP | 63-52261 | 3/1988 |
| JP | 63-89954 | 4/1988 |
| JP | 63-318663 | 12/1988 |
| KR | 94-9824 | 10/1994 |
| WO | WO 84/04983 | 12/1984 |
| WO | WO 86/04434 | 7/1986 |
| WO | WO 87/01858 | 3/1987 |
| WO | WO 87/02819 | 5/1987 |

OTHER PUBLICATIONS

"82C08 CHMOS Dynamic RAM Controller", Intel Corporation, Jun. 1985.*

"51C64H High Performance Ripplemode 64K×1 CHMOS Dynamic RAM", Intel Corporation, Jun. 1984.*

82CO8 CHMOS Dynamic Ram Controller, Intel Corp., pp. 3–1–3–33, Jun. 1985, (82C08).

Multibus® Bus Architecture Specification Handbook, Intel Corp., 1985.

51C64H High Performance Ripplemode 64K×1 CHMOS Dynamic RAM, Intel Corp., pp. 2–1–2–20, Jun. 1984.

iSBC® MEM/312/310/320/340 Memory Boards User's Guide, Intel Corp., Feb. 1985.

iSBC® 286/100 Multibus® II Single Board Computer Datasheet, published Mar. 1985.

2164A Family 65,536×1 Bit Dynamic RAM, Intel Corp., published in Jan. 1982 as part of a book entitled Component Data Catalog.

Multibus® II Bus Architecture Specification Handbook; Intel Corp.; Sheets 1–1 to 6–37; Copyright 1983.

iAPX 86/88, 186/188 User's Manual, Hardware Reference; Intel Corp.; pp. 1–1 to 1–148; Dated 1985.

iAPX 286 Hardware Reference Manual; Intel Corp.; pp. i–xiv and 1–1 to A–146; Dated 1983.

82C08 User's Manual, by Sridhar Begur; Intel Corp.; pp. 1–152 to 1–202; Dated Oct. 1986.

iSBC® 286/100A Multibus® II Single Board Computer; Intel Corp.; pp. 5–10 to 5–17; Dated Nov. 1986.

82258 Advanced DMA Controller Architectural Overview; Intel Corp.; pp. 1–11; Dated Jun. 1983.

82258 Advanced Direct Memory Access Coprocessor (ADMA); Intel Corp.; pp. 1–57; Dated Feb. 1985.

Intel Multibus® Interfacing, Intel Corp.; by Joe Barthmaier; pp. 1–39 to 1–77; Dated Jan. 1983.

Multibus® II Starter System Overview Manual; Intel Corp.; pp. i–v and 1–1 to A–5; Copyright 1985.

Multibus® II Bus Architecture Specification Handbook; Intel Corp.; pp. i–iii; and sheets 1–1 to 6–37; Copyright 1984.

iSBC® 186/100 Multibus® II Single Board Computer; Intel Corp.; pp. 1–9; Dated Mar. 1986.

iSBC® 286/100 Multibus® II Single Board Computer; Intel Corp.; pp. 1–8; Dated Mar. 1985.

51C256H High Performance Ripplemode™ 256K×1 CHMOS Dynamic RAM; Intel Corp.; pp. 1–1 to 1–21; dated Jun. 1985.

51C258H High Performance Ripplemode™ 64K×4 CHMOS Dynamic RAM; Intel Corp.; pp. 1–36 to 1–55; dated Jun. 1985.

82C08 CHMOS Dynamic RAM Controller; Intel Corp.; pp. 3–1 to 3–33; Dated Jun. 1985.

M51C64HL High Performance Low Power Ripplemode™ 64K×1 CHMOS Dynamic RAM; Intel Corp.; pp. 4–22 to 4–39; dated Jun. 1985.

M51C256H High Performance Ripplemode™ 256K×1 CHMOS Dynamic RAM; Intel Corp.; pp. 4–40 to 4–58; dated Jun. 1985.

82C08 CHMOS Dynamic RAM Controller; Intel Corp.; pp. 1–29; Dated Feb. 1986.

82C08 CHMOS Dynamic RAM Controller; Intel Corp.; pp. 1–29; Dated Nov. 1986.

51C64H High Performance Ripplemode™ 64K×1 CHMOS Dynamic RAM; Intel Corp.; pp. 2–1 to 2–20; dated Jun. 1984.

51C64HL High Performance Low Power Ripplemode™ 64K×1 CHMOS Dynamic RAM; Intel Corp.; pp. 2–35 to 2–54; dated Jun. 1984.
51C256H High Performance Ripplemode™ 256K×1 CHMOS Dynamic RAM; Intel Corp.; pp. 2–55 to 2–72; dated Jun. 1984.
51C256HL High Performance Low Power Ripplemode™ 256K×1 CHMOS Dynamic RAM; Intel Corp.; pp. 2–85 to 2–102; dated Jun. 1984.
82C08 CHMOS Dynamic RAM Controller; Intel Corp.; pp. 6–1 to 6–6; Dated Nov. 1984.
80286 High Performance Microprocessor with Memory Management and Protection (80286–12, 80286–10, 80286–8, 80286–6); Intel Corp.; pp. 3–1 to 3–54; dated Nov. 1986.
iAPX 286/10 High Performance Microprocessor with Memory Management and Protection; Intel Corp.; pp. 4–1 to 4–50, Copyright 1982.
iAPX 286/10 High Performance Microprocessor with Memory Management and Protection (80286–10, 80286–8, 80286–6); Intel Corp.; pp. 4–1 to 4–55, dated Nov. 1985.
Notice of Motion and Motion to Amend Quanta Defendants' Final Invalidity Contentions.
"Microcomputer Systems: The 8086/8088 Family, Architecture, Programming and Design," Second Edition by Yu cheng Liu and Glenn A. Gibson, pp. i–ix and pp. 1–623, published in 1986 by Prentice–Hall, Inc.
"80386: A Programming and Design Hanbook," by Penn Brumm and Don Brumm, pages include "Table of Contents"—ix and 1–452, copyright 1987 by TAB Books, Inc., ISBN 8–8306–2937–8.
Defendants' Preliminary Invalidity Contentions (pp. 1–4) Including Claim Chart '645A, Claim Chart '645B, Claim Chart '645C and Claim Chart '645D.
Quanta Computer, Inc., Quanta Computer USA, Inc., and Q–Lity Computer, Inc.'s Provisional Preliminary Invalidity Contentions Pursuant to Patent Local Rule 3–3 and Related Document Production Pursuant to Patent Local Rule 3–4, (pp. 1–5) Including Claim Charts.
AFC Defendants' Final Invalidity Contentions [Patent Local Rule 3–6] (pp. 1–4) Including Claim Chart '645A, Claim Chart '645B, Claim Chart '645C and Claim Chart '645D.
Quanta Computer, Inc., Quanta Computer USA, Inc., and Q–Lity Computer, Inc.'s Final Invalidity Contentions Pursuant to Patent Local Rule 3–6(b) (pp. 1–3) Including Exhibit 'A'.
"CMOS Memories, DRAMs & SRAMs," Vitelic, pp. 1–11, Copyright 1985.
Memory Databook 1985, Oki Semiconductor, 1st Edition, pp. 66–83, Dec. 1984.
1984/1985 Microelectronic Data Book, Mostek Corporation, pp. IV–1 and IV–7 to IV–9, copyrighted 1984.
1984 Intel Memory Components Handbook, Intel Corporation AP131, AP133, AP73, Dated 1984.

Japanese language version and English Translation of "A Multiprocesor with Distributed OS Functions on Each Processor Element," Institute of Electronics, Information and Communication Engineers of Japan, pp. 35–45 of Japanese Text, dated Nov. 21, 1986, along with Letter Certifying Translation.
"Mini/Microcomputer Hardware Design," by George D. Kraft and Wing N. Toy, pp. 432–450 published by Prentice Hall (1979).
Oki's Initial Disclosure of Prior Art to the '645 Patent Pursuant to Local Rule 16–7(d) (pp. 1–11).
Counterclaim Defendants' Response Chart Pursuant to Civil Local Rule 16–9(b) (pp. 2–121).
"A 1–Mbit CMOS DRAM with Fast Page Mode and Static Column Mode," Saito et al., IEEE Journal of Solid–State Circuits, vol. SC–20 No. 5, Oct. 1985.
Japanese Language Article from "Interface," pp. 306–321 and 380; dated at least May 1985, an English language translation of the article and a Letter of Translation Certification.
"Addressing Modes in Brief," Electronic Design, author unknown, p. 101, Aug. 18, 1983.
Intel Corporation—Microsystem Components Handbook—"Microprocessors and Peripherals vol. II," 1985, pp. 5–15 to 5–29.
iSBC MEM/312/310/320/340 Memory Boards User's Guide, Copyright 1985, Intel Corporation, pp. i to xiv, Index–1 to Index–6 and 1–1 to 10–52. (Bates No. 1022DOC00001 to 1022DOC00172).
2164A Family 65,536×1 Bit Dynamic RAM, dated Apr. 1992, Intel Corporation, pp. 3–267 to 3–279 (Bates Nos. 1022DOC00173 to 1022DOC00186).
Component Data Catalog, Jan. 1982, Intel Corporation, pp. i to vii and 1–56 to 1–71 (without pp. 1–64 and 1–65) (Bates Nos. 1022DOC00187 to 1022DOC00209).
Interfacing Dynamic RAM to iAPX 86, 88 Systems Using the Intel 8202A and 8203; by Brad May, dated Apr. 1982, Intel Application Note AP–97A, pp. 3–110 to 3–145 (Numbered QUAN 166865 to QUAN 166900).
Declaration of Peter J. Wied in Support of Defendants' Miscellaneous Administrative Request (with attached Exhibits A and B).
[Proposed] Order Granting Defendants' Miscellaneous Administrative Request to File Supplemental Declaration of Professor John D. Kubiatowicz, Ph.D. (Civil L.R. 7–10).
Defendants' Miscellaneous Administrative Request to File Supplemental Declaration of Professor John D. Kubiatowicz, Ph.D. (Civil L.R. 7–10).
Supplemental Declaration of Professor John D. Kubiatowicz, Ph.D. in Support of Defendants' Motion for Summary Judgment of Invalidity of the '645 Patent (with Exhibit A and without Exhibits B–E).

* cited by examiner

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–20 is confirmed.

* * * * *